United States Patent [19]

Hill

[11] Patent Number: 4,563,648
[45] Date of Patent: Jan. 7, 1986

[54] GEOMETRIC COMPENSATION OF MAGNETIC SUSCEPTIBILITY PERTURBATIONS IN AN RF SPECTROMETER

[75] Inventor: Howard D. Hill, Cupertino, Calif.

[73] Assignee: Varian Associates, Inc., Palo Alto, Calif.

[21] Appl. No.: 534,899

[22] Filed: Sep. 22, 1983

[51] Int. Cl.$^4$ .................................................. G01R 33/08
[52] U.S. Cl. ..................................... 324/318; 324/300
[58] Field of Search .............. 324/300, 307, 309, 318, 324/319, 320, 322

[56] References Cited

U.S. PATENT DOCUMENTS 4,095,168  6/1978  Hlavka ................................. 324/322
4,398,149  8/1983  Zens ..................................... 324/319

FOREIGN PATENT DOCUMENTS 2070254  9/1981  United Kingdom .

OTHER PUBLICATIONS

RSI, vol. 36, No. 10, 1965, pp. 1509–1510, "High Resolution NMR Probe Suitable for Use in a Superconducting Solenoid", by S. Meiboom et al.

Primary Examiner—Michael J. Tokar
Attorney, Agent, or Firm—Stanley Z. Cole; Edward H. Berkowitz

[57] ABSTRACT

In a gyromagnetic analysis apparatus where the sample is spun about an axis to average over azimuthal inhomogeneities, the axial magnetic properties of the sample space are improved by shaping the coil conductor as a function of axial coordinate to exhibit a continuous, axially uniform magnetic susceptibility distribution in the sense of a cyclindrical average.

6 Claims, 6 Drawing Figures

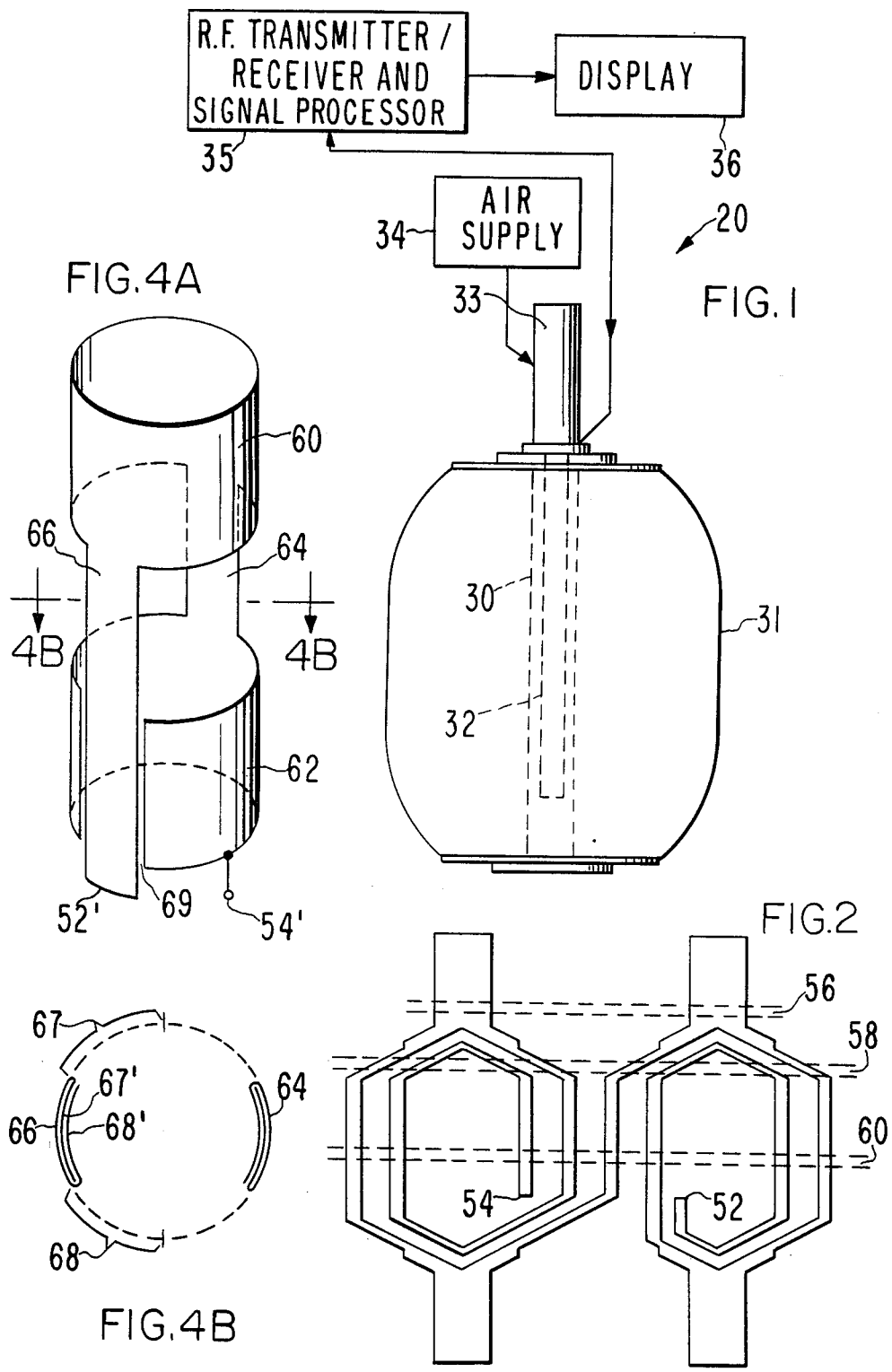

↓ (SEE FIG.3B)

GEOMETRIC COMPENSATION OF MAGNETIC SUSCEPTIBILITY PERTURBATIONS IN AN RF SPECTROMETER

FIELD OF THE INVENTION

The present invention relates generally to analytic instrumentation based upon magnetic resonance phenomena and particularly relates to reduction of magnetic perturbations due to inherent structure in the probe of an NMR spectrometer.

BACKGROUND OF THE INVENTION

Saddle shaped coils are a preferred coil structure for achieving homogeneous fields within a volume for which the axial extent thereof is not large compared to its radial extension. This form is often favored for the cramped environs of an NMR spectrometer probe. The design of such coils and their limitations are discussed in, for example, Hoult and Richards, Journal of Magnetic Resonance, v. 24, pp 71–85, 1976 and Hoult, "Sensitivity Optimization" in Experimental Techniques in $^{13}C$ Spectrometry. As with all materials present in the sensitive volume of an NMR apparatus, the inherent magnetic properties of the coil constitute a perturbation of the magnetic field distribution within the volume.

One factor contributing a limitation on the achievable interior field uniformity arises from the finite magnetic susceptibility of the material forming the coils; the conductor, support forms, adhesives and the like. Measures intended to reduce inhomogeneities from this type of perturbation are discussed by Anderson, et al., U.S. Pat. No. 3,091,732, where it was sought to provide coil materials and bonding agents for securing the coil to a coil form, which materials were required to exhibit an effective gross magnetic susceptibility approximating air in which these components are necessarily immersed. Reduction of the magnetic susceptibility to zero (or near zero) through the teaching of U.S. Pat. No. 3,091,732 involves formation of a composite conductor of materials exhibiting dissimilar magnetic properties. The example of a wire comprising a platinum core within a copper sheath requires unusual control in fabrication due to the effects of variation in thickness and position of the platinum core. Alternative fabrication techniques for composites require equivalent close manufacturing control, difficult to achieve or subject to reduced yield in acceptable product. Further developments in manipulating the gross effective magnetic susceptibility of structural members are discussed by Zens, U.S. Ser. No. (482,344).

In addition to perturbations owing to finite magnetic susceptibility, there are perturbations which arise from symmetry properties of the same RF coil structure exhibiting the aforesaid finite magnetic susceptibility. High resolution nuclear magnetic resonance spectrometers routinely employ sample spinning to average over static magnetic inhomogeneities of the polarizing field. Materials exhibiting a susceptibility $\chi_o$, which are not uniformly distributed azimuthally about the sensitive volume are then averaged to yield a reduced effective magnetic susceptibility $\chi = \chi_o f(\theta, t)$, equivalent to smearing the magnetic properties of such materials (especially the coil conductive materials) over a circumferential surface which, however, has no effect upon the axial distribution thereof. It is the axial distribution which remains inhomogeneous.

It is known in the deflection coil art to construct saddle coils with dimensions of component conducting portions which exhibit variation in width and length to distribute the magnetic field radially and axially according to a selected trigonometric function of the deflection angle of a charged particle beam deflected by such angle from the coil axis. Such a system is shown in U.S. Pat. No. 2,830,212.

Accordingly, it is an object of the present invention to geometrically compensate for finite magnetic properties of discrete conductive structures of an RF probe of a high resolution RF spectrometer.

BRIEF DESCRIPTION OF THE INVENTION

The invention is understood by considering a radial section of a saddle coil structure at a point z on the axis of such structure. The material is distributed at constant radius over discrete azimuthal regions which are effectively averaged by relative rotation of the sample. The mass of the conducting material of the probe coil within an axial increment δ z of the section considered is then required to be a constant for any section dz independent of z.

In a preferred embodiment the constraint is satisfied for a constant thickness (radial extent) of conductor material by variation of the area of the conductor as a function of z. This is accomplished by forming saddle coil windings in planar form with the winding portions varied to secure the desired axial distribution of conductor material.

In another embodiment, the thickness of the conductor is varied as a function of z to assure that the axial distribution of conductor material remains independent of z.

An alternative embodiment is directed to utilizing the above-described geometrical constraints to produce a susceptibility dependance in the axial direction. This controlled function G(z) is easily corrected by an appropriate field gradient and the resulting homogeneity can be adjusted to secure further compensatory effect upon other perturbations.

BRIEF DESCRIPTION OF THE DRAWINGS

FIG. 1 is a schematic diagram of the context of the present invention.

FIG. 2 is an example in planar form of a saddle coil of the present invention.

FIG. 4a is a view of another embodidment of the present invention.

FIG. 4b is a section through the embodiment of FIG. 4a.

DESCRIPTION OF THE PREFERRED EMBODIMENT

Figure 3A:
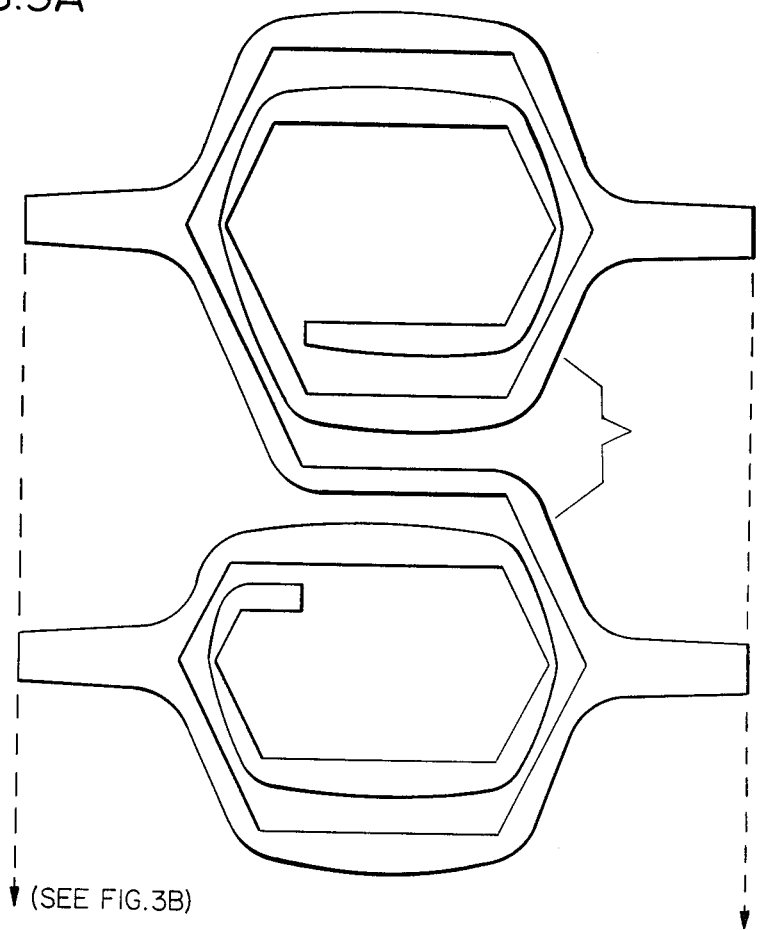
FIG. 3a is an example in planar form of a saddle coil exhibiting an axially varying susceptibility.

Referring now to FIG. 1, an NMR spectrometer 20 is shown in a schematic block diagram form to include a high field superconducting magnet 31 with a bore 30 in which a probe 32 is located. Secured to the top of the probe is a spinner assembly 33 which receives a sample tube, not shown. Spinner assembly 33 supports the spinning of the sample tube in the magnetic field implemented from an air supply 34 connected to the spinner to provide rotation thereto. An RF transmitter/receiver and signal processor 35 is connected to the probe 32, which probe includes coils, not shown, for exciting and detecting resonance spectra of the sample in the sample tube. The signal processor also includes means for displaying the spectrum of the sample under examination as indicated symbolically by display means 36.

One embodiment of the invention is ascertained from FIG. 2 which shows a pattern for a saddle coil 50. The pattern shown is in the planar form, e.g., the saddle coil is unrolled. Typically, the pattern is etched from a copper sheet of constant thickness and shaped around a cylindrical form. The resulting coil is tuned to the desired resonance properties by means well known in the art. See for example, Hoult, "Progress in NMR Spectroscopy", v. 12, pp. 41–77 (1978). Terminals 52 and 54 are connected to gating circuits which connect the coil to the transmitter, or in alternative time intervals the preamplifier of the receiver. Such circuitry is well known and outside the scope of the invention.

It will be observed that the characteristic property of the invention is compactly described by requiring that representatives slices 56, 58 and 60 of constant width $\delta$ z exhibit the identical area of the conductor material independent of z. If the conductor is of constant thickness, as assumed, the material will average upon rotation to an axial distribution of constant average susceptibility. The extreme axial portions of the coil of FIG. 2 serve to displace magnetic perturbations (arising from the ends of the structure) from the sensitive volume of the coil.

In the above description, the axial distribution of magnetic susceptibility was uniform. This is by no means a limitation of the invention even where a resulting axially uniform sample space is desired. One may specifically tailor the axial dependence of susceptibility to be a desired function of the axial coordinate. A compensatory gradient is then applied to yield a resulting constant axial resultant field.

Figure 3B:
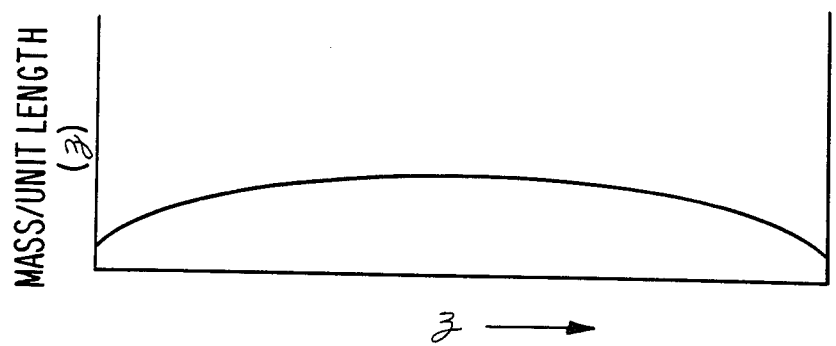
FIG. 3b is a projection on the z axis of the summed projection on the z axis of the mass of the FIG. 3a coil.

FIG. 3 shows a saddle coil in planar form as in FIG. 1 which is intended to produce a desired dependence of cylindrically averaged susceptibility upon the axial coordinate. The dimensions of the saddle coil here pictured have been altered to produce the radially summed, axial mass distribution shown in FIG. 3b which has a desired shape. Any such distribution may be specified and an appropriately shaped saddle coil pattern tailored accordingly.

Turning now to FIG. 4a, there is shown another embodiment for an RF probe structure of the present invention. The embodiment comprises two antiparallel current carrying links 64 and 66 which yield a suitable RF field distribution in the cylindrical sample space there defined.

As in the previously discussed embodiment, it is desired that the structure should exhibit a constant axial distribution of material and therefore, a magnetic perturbation which contributes no axial gradient. The structure is formed by cutting the material on three sides to form a window the entire material from which is folded back on the fourth side against the current carrying link as shown in FIG. 4b. A slot 69 is provided to electrically isolate terminal 54' from terminal 52'.

A minor axial discontinuity in RF coupling to the sample is created in this embodiment due to the increased thickness (radial extension) of the structure in the sensitive region due to the additional thicknesses from the folded flaps 67' and 68', for example. Inasmuch as the material thickness is of the order of a mil, the effect is small and may be considered negligible compared to the static magnetic susceptibility discontinuity which is thereby compensated.

It is to be understood that many changes can be made in the specifically described embodiments without departing from the scope of the invention and that the invention is to be determined from the scope of the following claims, not limited to the specifically described embodiments.

What is claimed is:

1. An improved probe coil for an NMR spectrometer comprising,
   conductive material having a finite magnetic susceptibility displaced at substantially constant radial displacement from an axis and forming a saddle coil about said axis, and
   the distribution of said material per unit axial length comprises a constant distribution with respect to displacement along said axis.

2. The improved probe coil of claim 1 wherein said conductive material exhibits a constant dimension of thickness along said radial displacement and the area of said conductor in a circumferential surface is configured to maintain said axial distribution.

3. The improved probe coil of claim 1 wherein the thickness of said conductive material along the radial displacement thereof is configured to maintain said uniform axial distribution.

4. An improved probe coil from an NMR spectrometer comprising
   conductive material having a finite magnetic susceptibility displaced at substantially constant radial displacement from an axis and forming a saddle coil about said axis, and
   the distribution of said material per unit axial length dependent upon displacement along said axis, and means for imposing an axial magnetic field gradient over the volume defined by said saddle coil, said gradient of such sign and magnitude to yield, in combination with said distribution of said material, a desired magnetic field distribution within said volume.

5. The improved probe coil of claim 4 wherein said desired magnetic field distribution within said volume is uniform.

6. Apparatus for supporting an RF field within a cylindrical volume element comprising:
   a tubular conductor exhibiting an axis and a uniform wall thickness between an inner surface and an outer surface, said tubular conductor comprising two tubular end portions and at least two distinct links between said tubular end regions, each said link an arcuate portion of said wall thickness formed by
   (a) cutting said wall on three sides of each of two four-sided wall portions adjacent each said link, a fourth side of said portion comprising one edge of said link,
   (b) folding one said four-sided wall portion against said link on the inner surface thereof, and
   (c) folding the other said four-sided wall portion against the outer surface of said link,
   electrically isolating one said link from one said end portion by cutting both edges of said link from one said tubular end portion whereby said apparatus exhibits a substantially constant axial mass distribution at substantially constant radius from said axis.

* * * * *